United States Patent
Higashii et al.

(10) Patent No.: US 9,220,175 B2
(45) Date of Patent: Dec. 22, 2015

(54) ELECTRONIC DEVICE AND CONTACT MEMBER

(75) Inventors: Tatsuya Higashii, Kanagawa (JP); Takahiro Naruse, Kanagawa (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 204 days.

(21) Appl. No.: 13/977,360

(22) PCT Filed: Jan. 18, 2012

(86) PCT No.: PCT/JP2012/000267
§ 371 (c)(1),
(2), (4) Date: Jun. 28, 2013

(87) PCT Pub. No.: WO2012/101986
PCT Pub. Date: Aug. 2, 2012

(65) Prior Publication Data
US 2013/0279131 A1    Oct. 24, 2013

(30) Foreign Application Priority Data

Jan. 24, 2011 (JP) .................... 2011-012253

(51) Int. Cl.
*H05K 5/02* (2006.01)
*H04M 1/02* (2006.01)

(52) U.S. Cl.
CPC ........... *H05K 5/0247* (2013.01); *H04M 1/0216* (2013.01); *H04M 1/0233* (2013.01)

(58) Field of Classification Search
CPC . H05K 5/0247; H04M 1/0216; H04M 1/0233
See application file for complete search history.

(56) References Cited

U.S. PATENT DOCUMENTS

| 5,066,235 | A |   | 11/1991 | Kobayashi |
| 5,513,996 | A | * | 5/1996 | Annerino et al. ............... 439/95 |
| 5,934,916 | A | * | 8/1999 | Latal et al. ...................... 439/95 |
| 5,955,700 | A | * | 9/1999 | Slipy et al. ...................... 174/50 |
| 6,413,109 | B1 | * | 7/2002 | Kobayashi et al. ........... 439/326 |
| 6,670,559 | B2 | * | 12/2003 | Centola et al. ................ 174/261 |
| 7,430,129 | B1 | * | 9/2008 | Peng ............................. 361/807 |

FOREIGN PATENT DOCUMENTS

| JP |   | 2510187 | Y2 | 6/1996 |
| JP | 2006-054405 | A |   | 2/2006 |
| JP | 2007-273375 | A |   | 10/2007 |
| JP | 2009-017281 | A |   | 1/2009 |
| JP | 2010-220082 | A |   | 9/2010 |

OTHER PUBLICATIONS

International Search Report, mailed Feb. 28, 2012, for PCT/JP2012/000267, 4 pages.

* cited by examiner

*Primary Examiner* — Adrian S Wilson
*Assistant Examiner* — Abhishek Rathod
(74) *Attorney, Agent, or Firm* — Seed IP Law Group PLLC (57) ABSTRACT

An electronic device includes a housing, a circuit board contained in the hosing, a pin, and a fitting member. The pin is inserted, from outside, in a through-hole formed in a wall of the housing, and has a head which is exposed to the outside and a shaft portion which projects into an inside space of the housing. The fitting member has a linear shape, and is formed with a nip spring portion and a circuit board contact portion. The nip spring portion nips the shaft portion elastically in its radial direction in the inside space of the housing to contact with the pin projected as a contact. The circuit board contact portion is in contact with a contact of the circuit board.

5 Claims, 8 Drawing Sheets

ELECTRONIC DEVICE AND CONTACT MEMBER

TECHNICAL FIELD

The present invention relates to an electronic device in which the outside surface of a wall of a housing is provided with an external terminal and the external terminal is connected to a circuit board provided inside the housing, as well as to a contact member used in such an electronic device.

1. Background Art

Among electronic devices are ones in which a contact (terminal) connected to an external terminal is a spring-like member, the spring-like terminal is disposed between a board and a first housing, and the first housing and the board are disposed inside and attached to a second housing. When screws are screwed into the second housing, the first housing comes closer to the board to establish a state that the spring-like terminal is kept compressed by the first housing and the board.

In this electronic device, since the spring-like terminal is kept compressed, even when the interval between the first housing and the board is increased excessively, the spring-like terminal can accommodate the increase of the interval and good electrical continuity can be maintained between the spring-like terminal and the board (refer to Patent document 1, for example).

2. Prior Art Documents

PATENT DOCUMENTS

Patent document 1: JP-A-2007-273375 (Abstract, FIG. 4)

SUMMARY OF THE INVENTION

Problems to be Solved by the Invention

However, in the electronic device disclosed in Patent document 1, to maintain good electrical continuity between the terminal and the board, it is necessary to dispose the spring-like terminal and the screws inside the second housing. A large space is occupied by the spring-like terminal and the screws inside the second housing.

The present invention has been made to solve the above problem, and an object of the invention is therefore to provide an electronic device and a contact member capable of reducing an inside space of a housing in which a contact (terminal) is fixed and which is occupied by the terminal.

Means for Solving the Problems

An electronic device according to the invention comprises a housing; a pin that is inserted, from outside, in a through-hole formed in a wall of the housing, and has a head which is exposed to the outside and a shaft portion which projects into an inside space of the housing; and a fitting member that fixes the shaft portion in the inside space of the housing.

Since the pin has the shaft portion and the head and the shaft portion of the pin is fixed by the fitting member, the pin can be fixed to the fitting member reliably.

Furthermore, since the head of the pin is exposed to the outside of the housing, it is not necessary to secure, in the inside space of the housing, a space to be occupied by the head. That is, it suffices to secure, in the inside space of the housing, only a space to be occupied by the shaft portion of the pin and the fitting member. Thus, the space to be occupied by the pin and the fitting member inside the housing can be reduced.

The electronic device according to the invention further comprises a circuit board contained in the housing, and the fitting member has a contact portion which is in contact with a contact of the circuit board.

The fitting member has the contact portion, and the contact portion is brought into contact with the contact of the circuit board. Since the shaft portion of the pin is fixed to the fitting member in the inside space of the housing, the contact of the circuit board can be kept connected to the shaft portion of the pin via the fitting member by bringing the contact portion of the fitting member into contact with the contact of the circuit board.

In addition, since the fitting member has the contact portion, the fitting member for fixing the shaft portion of the pin can also serve as a contact member. Therefore, it is unnecessary to separately provide a contact member for connecting the shaft portion of the pin to the circuit board provided in the housing. Thus, further space saving can be attained in the inside space of the housing.

In the electronic device according to the invention, the contact portion projects in the thickness direction of the housing and the housing has a pair of holding ribs which hold the contact portion therebetween.

Since the housing has the pair of holding ribs which hold the contact portion therebetween, the pair of holding ribs prevent a fall or twist of the contact portion which is disposed on the circuit board side, whereby the contact portion can be connected to the circuit board reliably. Furthermore, even if the fitting member is made of a material that is thin and prone to be deformed such as a piano wire, reliable contact can be attained between the fitting member and the circuit board, which enables further space saving.

The electronic device according to the invention further comprises a ring-shaped double-sided adhesive tape which is interposed between the head and an outside surface of the wall.

Since the ring-shaped double-sided adhesive tape is interposed between the head and the outside surface of the wall, the double-sided adhesive tape reliably prevents the pin from coming off the housing.

Furthermore, the insertion of the ring-shaped double-sided adhesive tape between the head and the outside surface of the wall allows the head and the outside surface of the wall to be brought into close contact with each other reliably via the double-sided adhesive tape. As a result, the through-hole which is formed in the wall can be kept in a water-sealed state reliably and hence entrance of water through the through-hole can be prevented.

In the electronic device according to invention, the fitting member has a nip spring portion which nips the shaft portion elastically in its radial direction, and a guide rib is formed on an inside surface of the wall and guides the fitting member.

The fitting member has the nip spring portion, and the nip spring portion nips the shaft portion elastically in its radial direction. Therefore, when the shaft portion of the pin is inserted into the through-hole 61 from the outside of the housing, the nip spring portion is deformed elastically and the shaft, portion comes to be kept in contact with the nip spring portion, which facilitates the assembling.

In the electronic device according to the invention, the shaft portion is formed with a groove at a position corresponding to the position of the nip spring portion.

Since the shaft portion is formed with the groove, the nip spring portion can be fitted into the groove by inserting the shaft portion of the pin into the through-hole from the outside of the housing. As a result, the shaft portion is kept in reliable contact with the nip spring portion, which further facilitates the assembling.

A contact member according to the invention comprises a pin that has a shaft portion and a head which is larger than the shaft portion, and a fitting member that fixes the shaft portion.

Since the has the shaft portion and the head which is larger than the shaft portion and fitting member fixes the shaft portion of the pin, the pin can be fixed to the fitting member reliably.

A contact member according to another aspect of the invention comprises a pin configured to be inserted in a wall of a housing of an electronic device from outside, and has a head to be exposed to the outside and a shaft portion to project into an inside space of the housing, and a fitting member that fixes the shaft portion.

Since the head of the pin is exposed to the outside of the housing, it is not necessary to secure, in the inside space of the housing, a space to be occupied by the head. That is, it suffices to secure, in the inside space of the housing, only a space to be occupied by the shaft portion of the pin and the fitting member. Thus, the space to be occupied by the pin and the fitting member inside the housing can be reduced.

In the contact member according to the invention, the fitting member has a contact portion to come into contact with a contact of a circuit board and to project toward the circuit board.

The fitting member has the contact portion, and the contact portion is brought into contact with the contact of the circuit board. Since the shaft portion of the pin is fixed to the fitting member in the inside space of the housing, the contact of the circuit board can be kept connected to the shaft portion of the pin via the fitting member by bringing the contact portion of the fitting member into contact with the contact of the circuit board.

In addition, since the fitting member has the contact portion, the fitting member for fixing the shaft portion of the pin can also serve as a contact member. Therefore, it is unnecessary to separately provide a contact member for connecting the shaft portion of the pin to the circuit board provided in the housing. Thus, further space saving can be attained in the inside space of the housing.

In the contact member according to the invention, the fitting member has a nip spring portion which nips the shaft portion elastically in its radial direction.

The fitting member has the nip spring portion, and the nip spring portion nips the shaft portion elastically in its radial direction. Therefore, the nip spring portion is deformed elastically and the shaft portion comes to be kept in contact with the nip spring portion, which facilitates the assembling.

The contact member according to the invention further comprises a ring-shaped double-sided adhesive tape which is formed on the head so as to be located around a base portion of the shaft portion.

Since the ring-shaped double-sided adhesive tape is formed on the head so as to be located around the base portion of the shaft portion, the neighborhood of the shaft, portion can be kept in a water-sealed state reliably and hence entrance of water through the neighborhood of the shaft portion can be prevented.

In the contact member according to the invention, the shaft portion is formed with a groove at a position corresponding to the position of the nip spring portion.

Since the shaft portion is formed with the groove, the nip spring portion can be fitted into the groove. As a result, the shaft portion is kept in reliable contact with the nip spring portion, which further facilitates the assembling.

Advantageous Effects of the Invention

In the electronic device and the contact member according to the invention, the pin has the shaft portion and the head and the shaft portion of the pin is fixed by the fitting member. This provides an advantage that the pin can be fixed to the fitting member reliably.

Furthermore, since the head of the pin is exposed to the outside of the housing, it suffices to secure, in the inside space of the housing, only a space to be occupied by the shaft portion of the pin and the fitting member. This provides another advantage that the space to be occupied by the pin and the fitting member inside the housing can be reduced.

MODE FOR CARRYING OUT THE INVENTION

An electronic device and a contact member according to an embodiment of the present invention will be hereinafter described with reference to the drawings.

Figure 1:
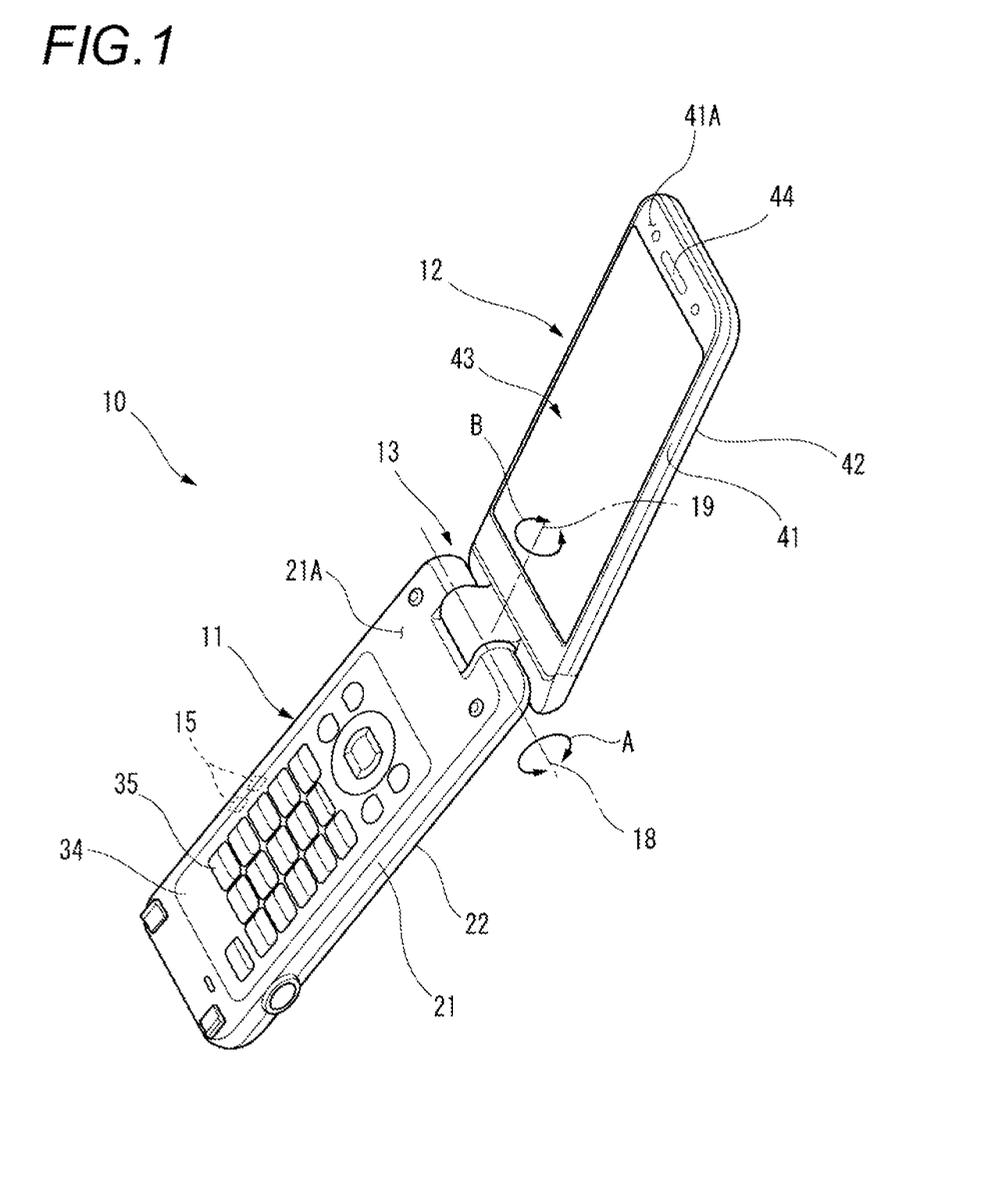
FIG. 1 is a perspective view of an electronic device according to the present invention which is in a use state (open state).

As shown in FIG. 1, the electronic device 10 according to the embodiment of the invention is a cell phone terminal in which a first housing (called a housing in the claims) 11 and a second housing 12 are connected to each other by a hinge 13 so as to be movable with respect to each other. The electronic device 10 is equipped with a pair of contact members 15 which are provided in the first housing 11 and a circuit board 16 (see FIG. 2) which is in contact with the pair of contact members 15.

The hinge 13 is a member which connects the first housing 11 and the second housing 12 in such a manner that they can rotate with respect to each other in the directions indicated by arrow A between a use state (open state) and a carrying state (closed state) about a first rotation axis 18. The hinge 13 also serves as a member which allows the second housing 12 to rotate in the directions indicated by arrow B about a second rotation axis 19. As such, the electronic device 10 is a two-axis swivel cell phone terminal having the first rotation axis 18 and the second rotation axis 19.

Figure 2:
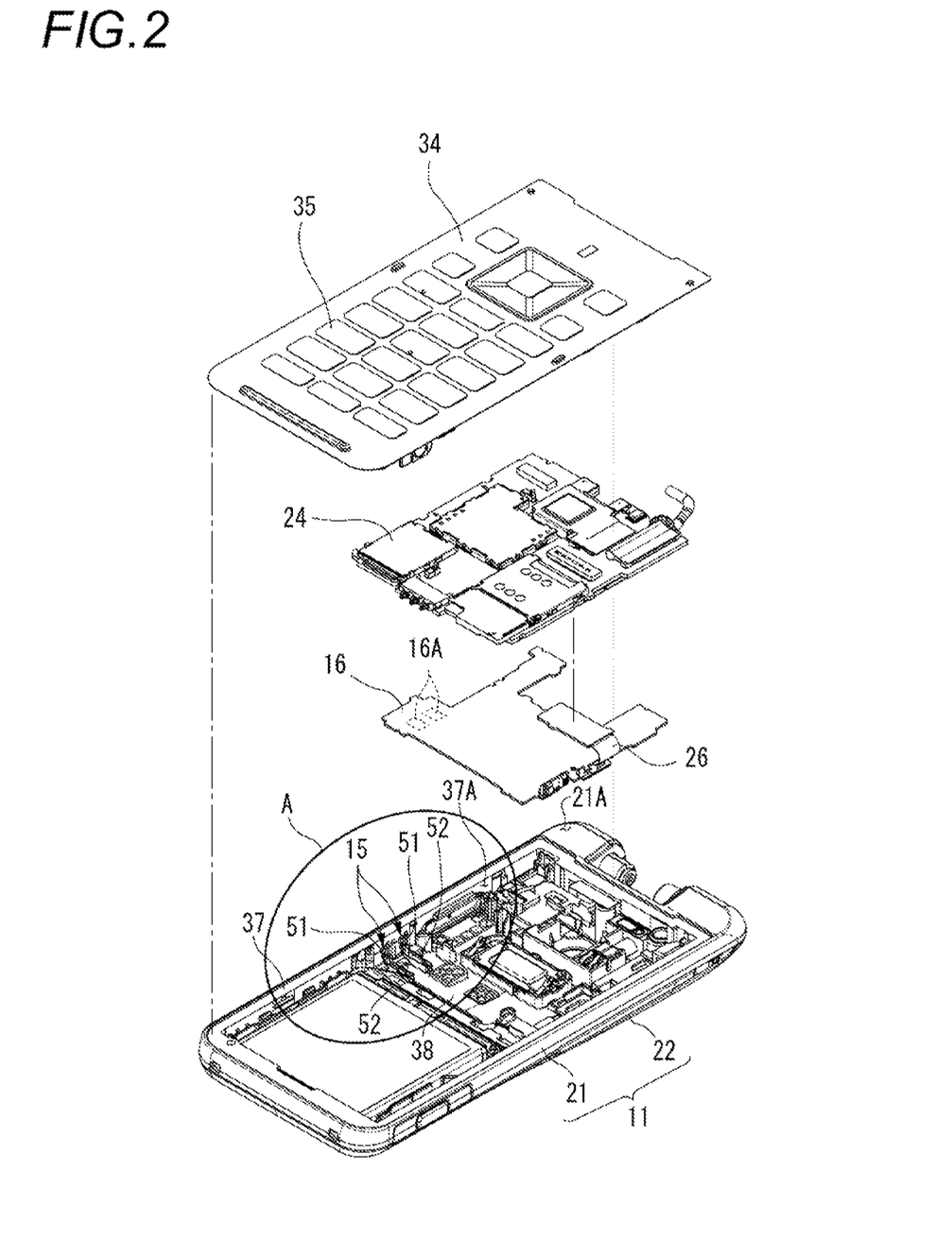
FIG. 2 is an exploded perspective view of a first housing shown in FIG. 1.

As shown in FIG. 2, the first housing 11 is formed by a first case 21 and a first cover 22 so as to have a generally rectangular-parallelepiped-shaped box shape and houses the circuit board 16 and electric components 24 inside.

The circuit board 16 is a board having a pair of contacts 16A which are in contact with the respective contact members 15 (more specifically, contact portions 52 of fitting members 51). The circuit board 16 is connected to the electric components 24 via a printed circuit board 26.

Figure 3:
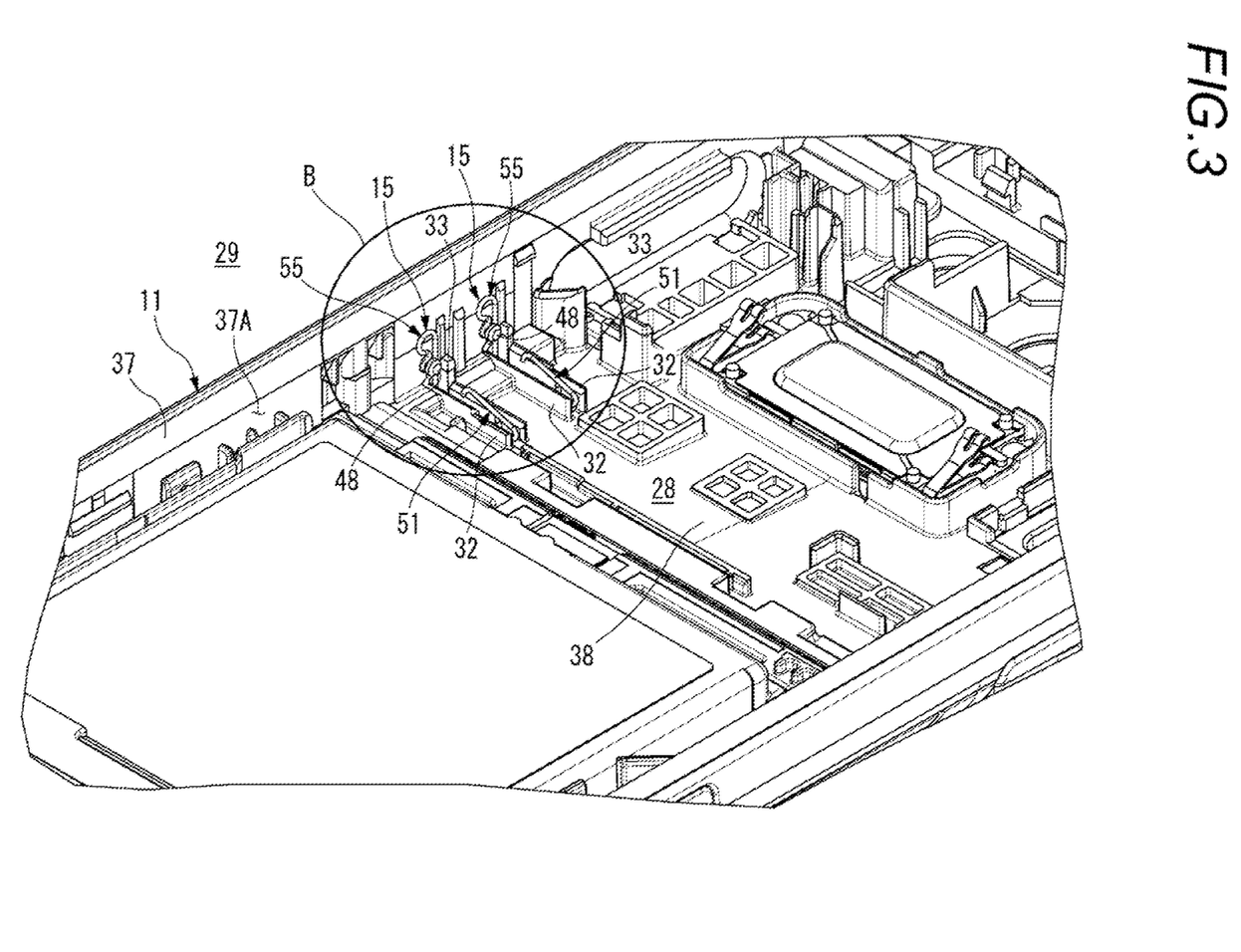
FIG. 3 is an enlarged view of part A of FIG. 2.
Figure 4:
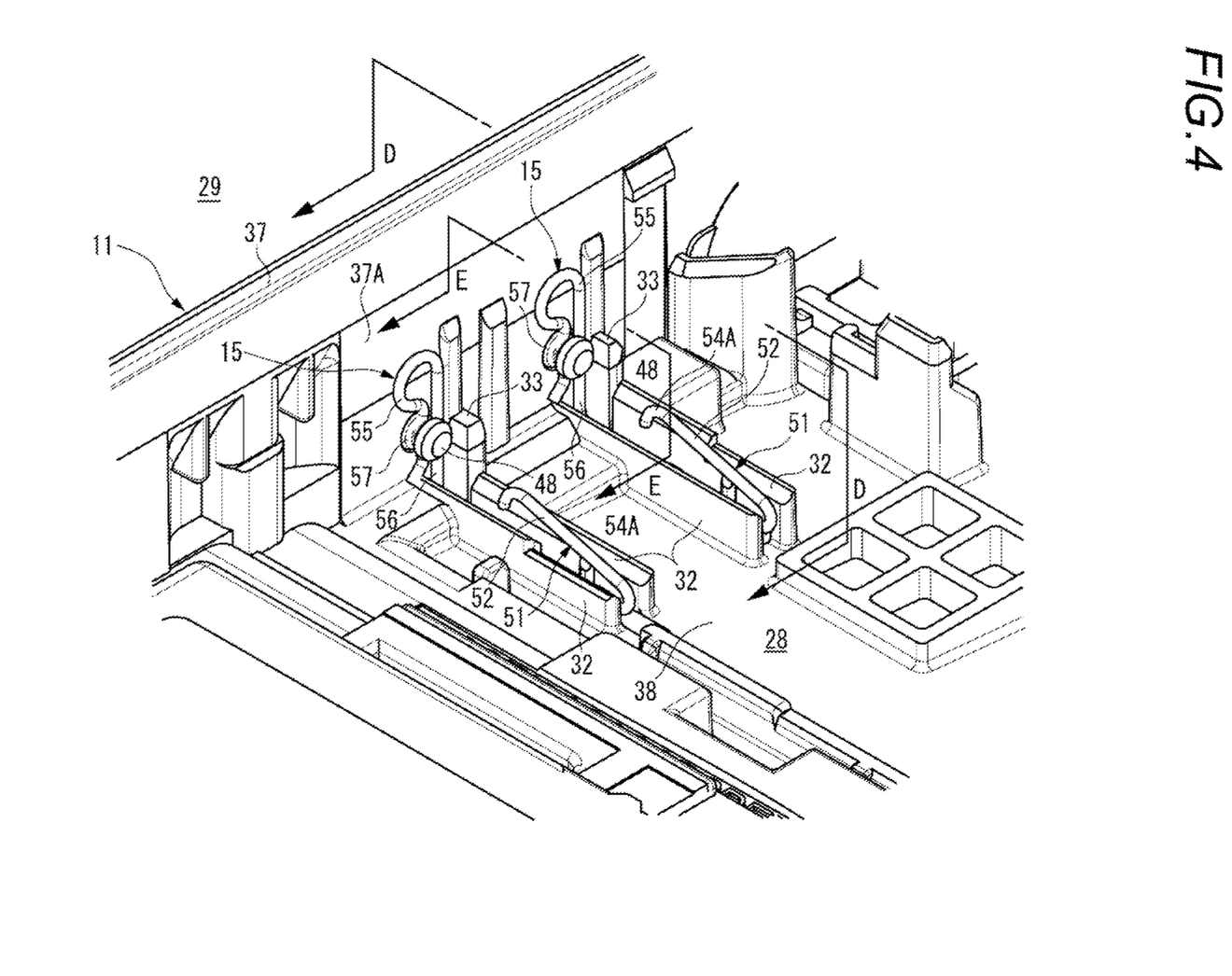
FIG. 4 is an enlarged view of part B of FIG. 3.

As shown in FIGS. 3 and 4, the first housing 11 is equipped with two pairs of holding ribs 32 which are disposed in an inside space 28 of the first housing 11 and each pair of holding ribs 32 are located on the two respective sides of the associated contact member 15 (the contact portion 52 of the associated fitting member 51). The first housing 11 is also equipped with a pair of guide ribs 33 each of which guides the associated contact member 15 (a nip spring portion 55 of the associated fitting member 51).

As shown in FIG. 2, a key sheet 34 is disposed so as to form part of a surface 21A of the first case 21, and is equipped with a manipulation unit 35.

As shown in FIG. 4, the two pairs of holding ribs 32 are spaced from each other by a prescribed interval L (see FIG. 6) so as to project from an inside surface 37A of a wall 37 of the first housing 11 into the inside space 28 in the width direction of the first housing 11. The two pairs of holding ribs 32 are erected upward from a bottom wall 38 of the first housing 11 and extend parallel with the respective contact members 15 (the contact portions 52 of the fitting members 51). Thus, the contact portion 52 of the associated fitting member 51 is contained and held between each pair of holding ribs 32.

The guide ribs 33 project from the inside surface 37A of the wall 37 of the first housing 11 into the inside space 28. Each guide rib 33 extends parallel with the nip spring portion 55 of the associated fitting member 51 and thereby guides the nip spring portion 55 so that the nip spring portion 55 is kept erected.

As shown in FIG. 1, the second housing 12 is formed by a second case and a second cover 42 so as to have a generally rectangular-parallelepiped-shaped box shape. A display unit 43 is disposed so as to form part of a surface 41A of the second case 41, and a receiver 44 is disposed in the surface 41A. The receiver 44 is a device which has a vibration plate (not shown) and generates, for example, a voice received during a call.

Figure 5:
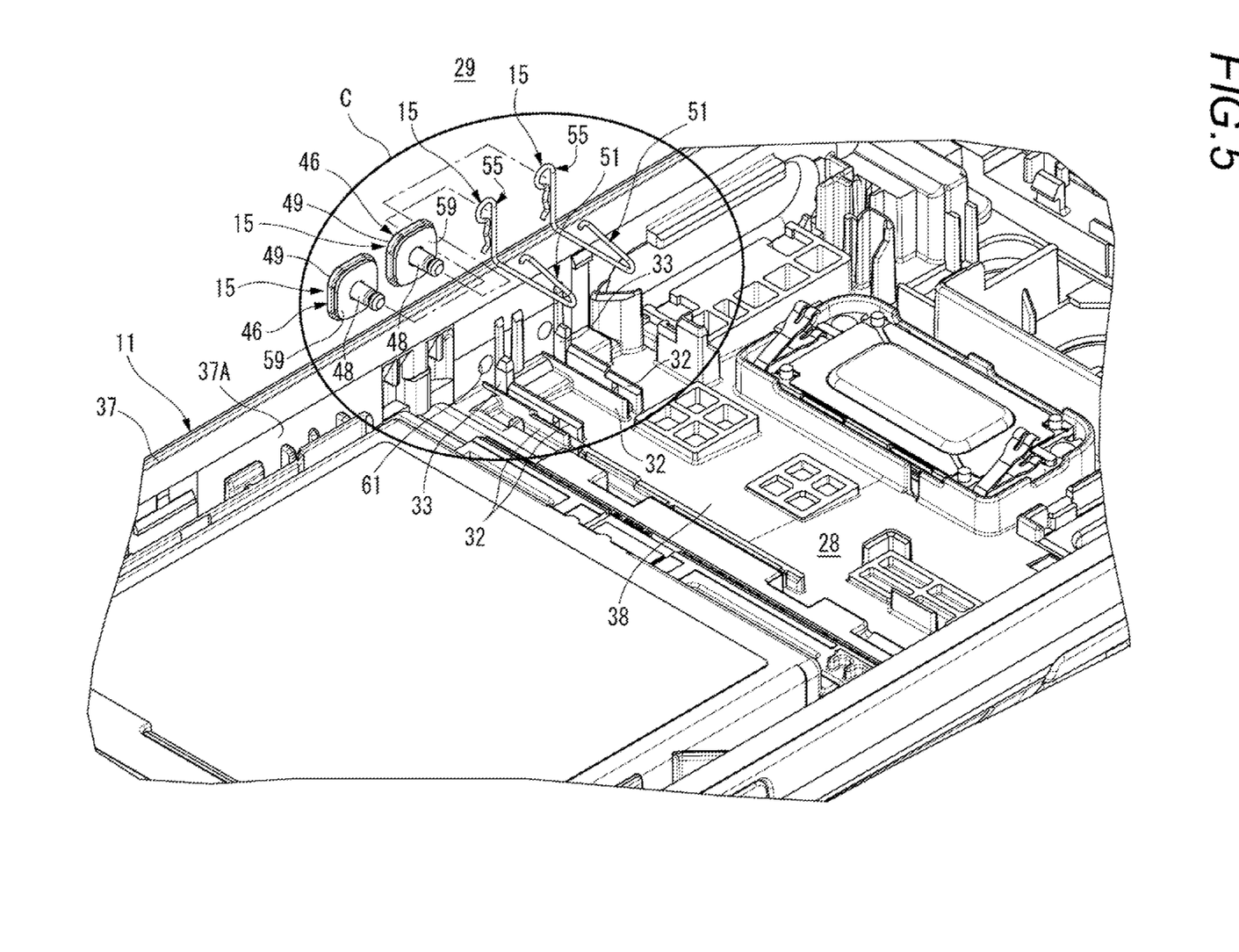
FIG. 5 is an exploded perspective view of the first housing and contact members shown in FIG. 4.
Figure 6:
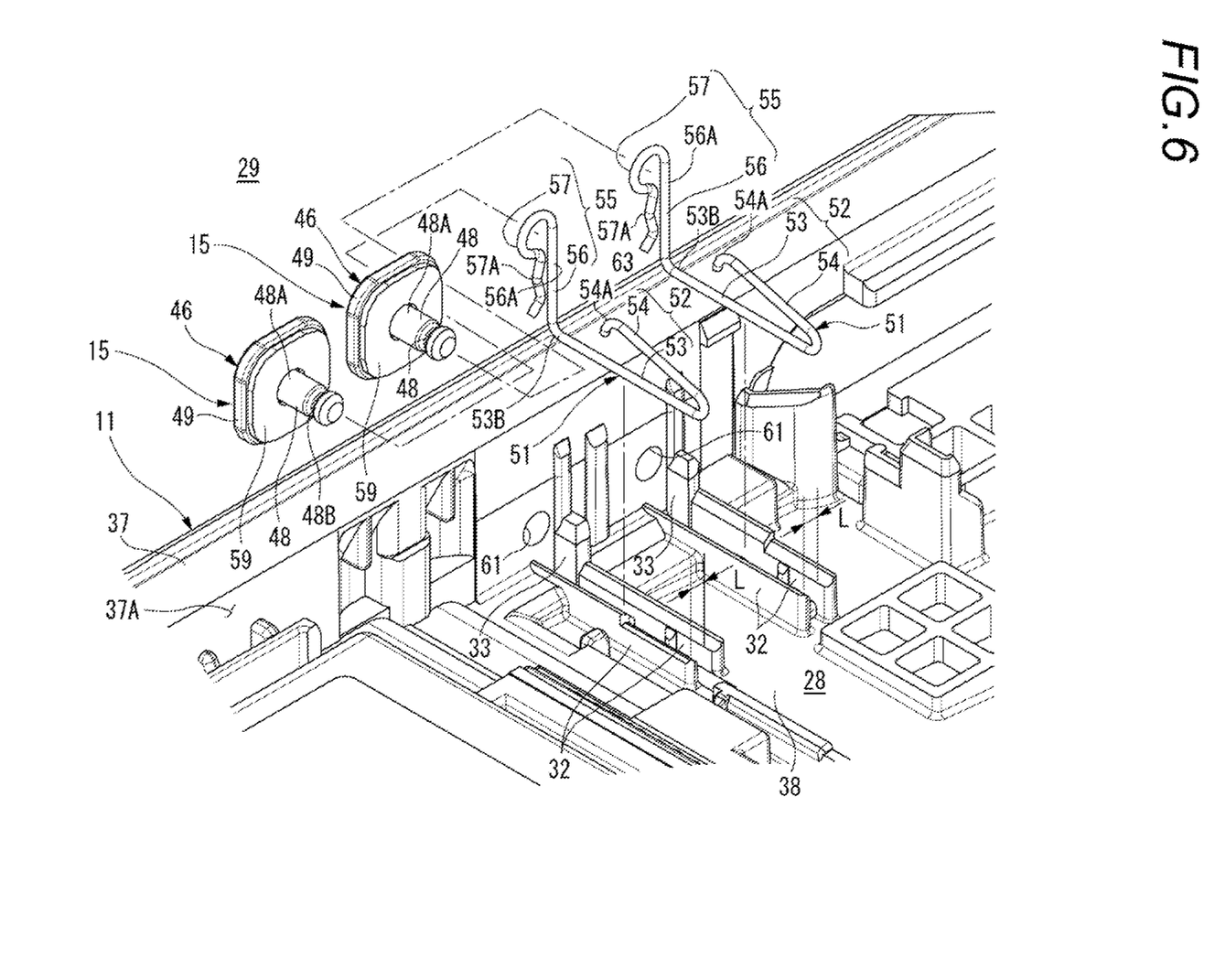
FIG. 6 is an enlarged view of part C of FIG. 5.

The pair of contact members 15 are provided in the first housing 11 and enable external charging. As shown in FIGS. 5 and 6, each contact member 15 has a pin (terminal) 46 which is inserted through the first housing 11 from outside, a fitting member 51 which fixes the pin 46, and a ring-shaped double-sided adhesive tape 59 which is located around a shaft portion 48 of the pin 46.

The pin 46 is a member which is inserted, from the outside 29, in a through-hole 61 formed in the wall 37 of the first housing 11 and serves as an external terminal. The pin 46 has a straight shaft portion 48 which is inserted in the through-hole 61 and a head 49 which is connected to a base portion 48A of the shaft portion 48.

The head 49 is a wide, generally rectangular terminal and projects from the shaft portion 48 in the radial direction. The shaft portion 48 extends in the width direction of the first housing 11, and is formed with a groove 48B at a position corresponding to the position of the nip spring portion 55 (described later) of the associated fitting member 51.

Figure 7:
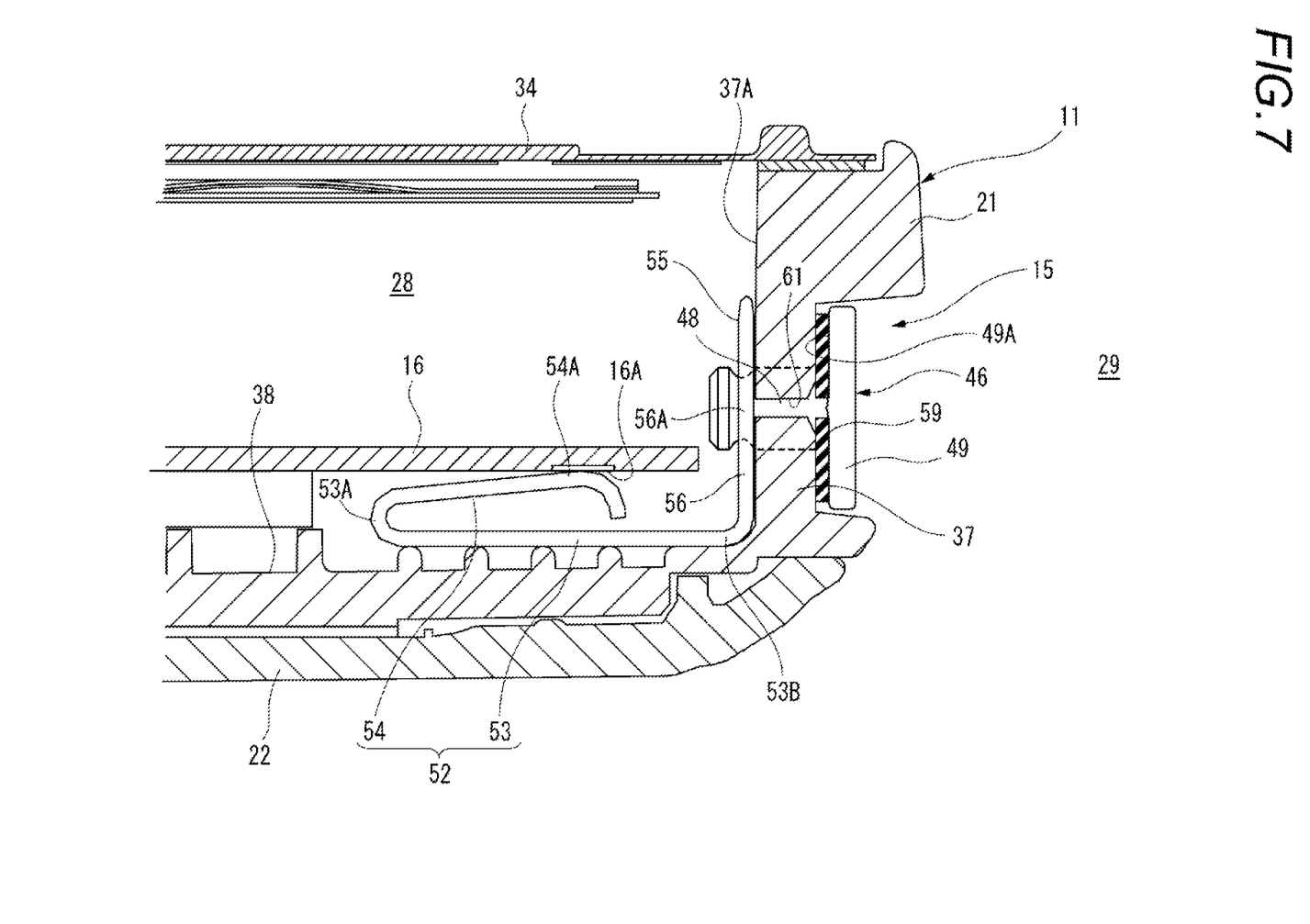
FIG. 7 is a sectional view taken along line D-D in FIG. 4.
Figure 8:
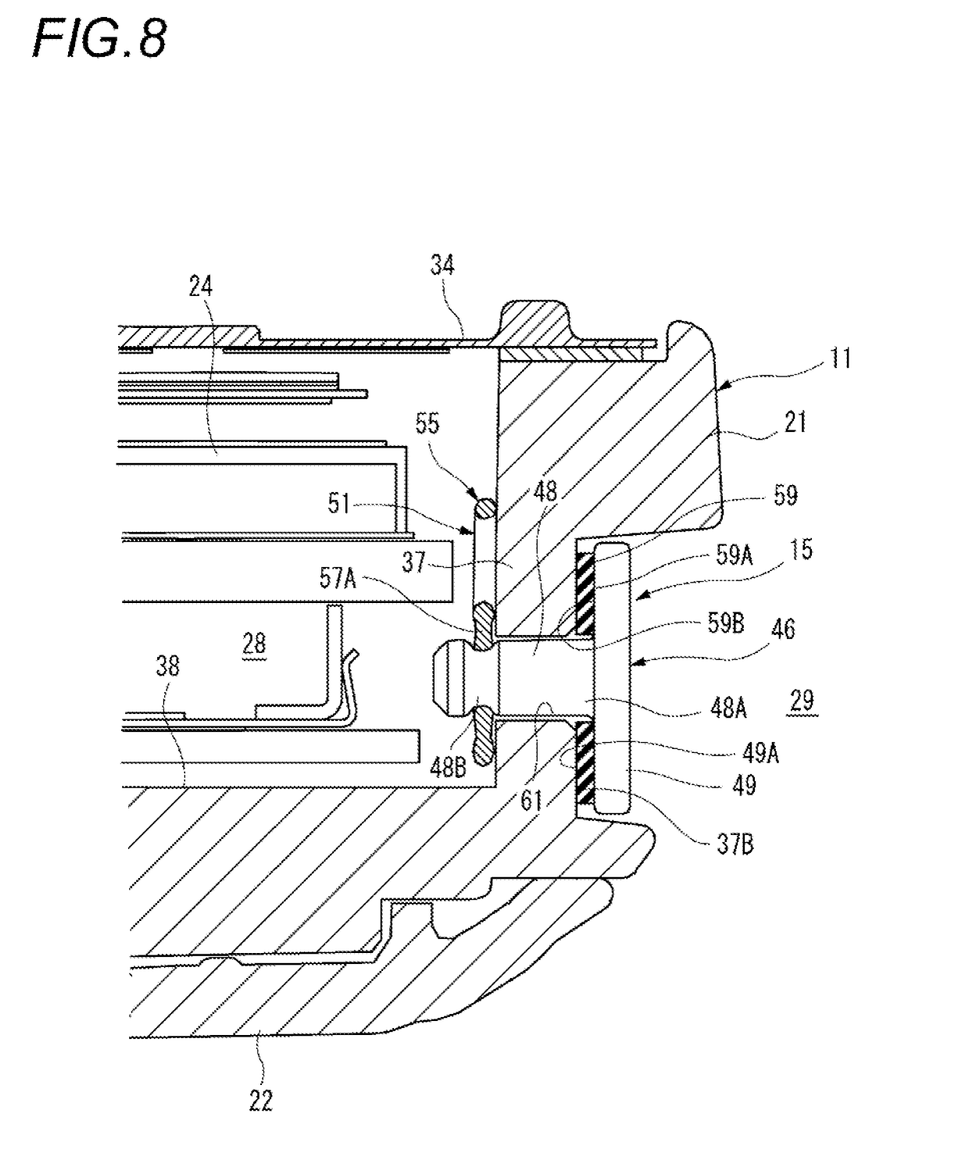
FIG. 8 is a sectional view taken along line E-E in FIG. 4.

The shaft portion 48 of the pin 46 is inserted in the through-hole 61 of the first housing 11 from the outside 29. In this state, as shown in FIG. 7, the head 49 of the pin 46 is exposed from the first housing 11 to the outside 29 and its shaft portion 48 projects in the inside space 28 of the first housing 11. As shown in FIG. 8, the nip spring portion 55 of the fitting member 51 is fitted in the groove 48B of the shaft portion 48 which projects in the inside space 28 of the first housing 11.

As shown in FIGS. 4 and 6, the fitting member 51 is a member formed by bending a piano wire. As shown in FIGS. 4 and 6, the fitting member 51 serves to fix the shaft portion 48 in the inside space 28 of the first housing 11 and to bring the pin 46 into contact with the circuit board 16 by contacting the associated contact 16A (see FIG. 2) of the circuit board 16.

The fitting member 51 has the contact portion 52 which is in contact with the associated contact 16A of the circuit board 16 and the nip spring portion 55 which nips the shaft portion 48 elastically in the radial direction. The contact portion 52 and the nip spring portion 55 are generally shaped like a figure L together when viewed sideways.

The contact portion 52 of the fitting member 51 is contained between the associated pair of holding ribs 32 and is thereby held by the pair of holding ribs 32. Therefore, the pair of holding ribs 32 prevent a fall or twist of the contact portion 52, whereby the contact portion 52 can be connected to the associated contact 16A of the circuit board 16 reliably. Furthermore, even if the fitting member 51 is made of a material that is thin and prone to be deformed such as a piano wire, reliable contact can be attained between the fitting member 51 and the circuit board 16, which enables further space saving.

As shown in FIGS. 6 and 7, the contact portion 52 has a horizontal rod 53 which extends parallel with the circuit board 16 and a contact rod 54 which is bent obliquely upward from a tip portion 53A of the horizontal rod 53. The horizontal rod 53 extends on the bottom wall 38 of the first housing 11 in its width direction and thereby extends parallel with the circuit board 16.

The contact rod 54 is bent from the tip portion 53A of the horizontal rod 53 so as to extend slantwise right over the horizontal rod 53. A tip portion of the contact rod 54 is bent so as to form a generally inverted-V-shaped peak portion 54A.

That is, in the contact portion 52, the contact rod 54 is bent slantwise and thereby projects from the horizontal rod 53 obliquely in the thickness direction of the first housing 11. Since the contact rod 54 projects obliquely in the thickness direction of the first housing 11 the peak portion 54A of the contact rod 54 comes into contact with the associated contact 16A of the circuit board 16.

The nip spring portion 55 has a vertical rod 56 which is erected vertically from a base portion 53B of the horizontal rod 53 and a spring rod 57 which is bent from a top portion of the vertical rod 56 so as to extend approximately parallel with the vertical rod 56. The vertical rod 56 is erected vertically from the base portion 53B of the horizontal rod 53 so as to extend parallel with the inside surface 37A of the wall 37 of the first housing 11, and has a lock portion 56A in the vicinity of its top portion. The lock portion 56A is locked in the groove 48B of the shaft portion 48 of the associated pin 46.

The spring rod 57 is bent from the top portion of the vertical rod 56 so as to extend parallel with the inside surface 37A and approximately parallel with the vertical rod 56. The spring rod 57 is a rod that can be deformed elastically in the directions in which it goes away from and comes closer to the vertical rod 56 and has a curved portion 57A which is locked in the groove 48B of the shaft portion 48.

The curved portion 57A of the spring rod 57 and the lock portion 56A of the vertical rod 56 form a space 63. The curved portion 57A of the spring rod 57 and the lock portion 56A of the vertical rod 56 extend in the direction that is perpendicular to the shaft portion 48 (i.e., parallel with the inside surface 37A of the wall 37 of the first housing 11).

When the shaft portion 48 is inserted into the space 63 which is formed by the curved portion 57A and the lock portion 56A of the nip spring portion 55, the lock portion 56A is deformed in such a direction as to go away from the curved portion 57A. In the state that the groove 48B of the shaft portion 48 is located in the space 63, the lock portion 56A and the curved portion 57A are locked in the groove 48A of the shaft portion 48 by the spring force of the nip spring portion 55.

That is, the nip spring portion 55 is such a portion that the groove 48 portion of the shaft portion 48 can be held elastically in the radial direction between the lock portion 56A of the vertical rod 56 and the curved portion 57A of the spring rod 57.

With the nip spring portion 55, when the shaft portion 48 of the pin 46 is inserted into the through-hole 61 from the outside 29 of the first housing 11, the nip spring portion 55 is deformed elastically and the shaft portion 48 comes to be kept in contact with the nip spring portion 55, which facilitates the assembling.

As shown in FIG. 4, the nip spring portion 55 is held by the associated guide rib 33 so as to be kept erected parallel with the inside surface 37A. Therefore, when the shaft portion 48 of the pin 46 is inserted into the through-hole 61 from the outside 29 of the first housing 11, the nip spring portion 55 is elastically deformed properly with its curved portion 57A held in place by the guide rib 33. As a result, the shaft portion 48 can reliably come into contact with the nip spring portion 55 which is elastically deformed properly.

In addition, since the shaft portion 48 is formed with the groove 48B, the nip spring portion 55 can be fitted into the groove 48B by inserting the shaft portion 48 of the pin 46 into the through-hole 61 from the outside 29 of the first housing 11. As a result, the shaft portion 48 is kept in reliable contact with the nip spring portion 55, which further facilitates the assembling.

As shown in FIGS. 7 and 8, the ring-shaped double-sided adhesive tape 59 is formed on the head of each pin 46 so as to be located around the base portion 48A of the shaft portion 48 (also see FIG. 6). In the state that the pin 46 is inserted in the through-hole 61 of the first housing 11, the double-sided adhesive tape 59 is interposed between the head 49 of the pin 46 and an outside surface 378 of the wall 37 of the first housing 11.

In this state, one adhesive surface 59A of the double-sided adhesive tape 59 is bonded to a back surface 49A and the other adhesive surface 59B of the double-sided adhesive tape 59 is bonded to the outside surface 37B of the wall 37. This structure can reliably prevent the pin 46 from coming off the first housing 11.

Furthermore, the insertion of the ring-shaped double-sided adhesive tape 59 between the outside surface 37B of the wall 37 and the head 49 allows the outside surface 37B of the wall 37 and the head 49 to be brought into close contact with each other reliably via the double-sided adhesive tape 59. As a result, the through-hole 61 which is formed in the wall 37 can be kept in a water-sealed state reliably and hence entrance of water through the through-hole 61 can be prevented.

As described above, in the electronic device 10, the nip spring portion 55 is disposed perpendicularly to the shaft portion 48 and nips the groove 48B portion of the shaft portion 48, whereby the pin 46 can be fixed to the fitting member 51 reliably.

In this state, the head 49 of the pin 46 is exposed to the outside 29 of the first housing 11. Therefore, it is not necessary to secure, in the inside space 28 of the first housing 11, a space to be occupied by the head 49. That is, it suffices to secure, in the inside space 28 of the first housing 11, only a space to be occupied by the shaft portion 48 of the pin 46 and the fitting member 51. Thus, the space to be occupied by each contact member 15 in the inside space 28 of the first housing 11 can be reduced.

Furthermore, each fitting member 51 has the contact portion 52 and the peak portion 54A of the contact portion 52 is in contact with the associated contact 16A of the circuit board 16. As a result, the contact 16A of the circuit board 16 can be kept connected to the shaft portion 48 of the associated pin 46 via the fitting member 51.

In addition, since each fitting member 51 has the contact portion 52, the fitting member 51 for fixing the shaft portion 48 of the associated pin 46 can also serve as a contact member. Therefore, it is unnecessary to separately provide a contact member for connecting the shaft portion 48 of each pin 46 to the circuit board 16 provided in the first housing 11. Thus, further space saving can be attained in the inside space 28 of the first housing 11.

The electronic device and the contact member according to the embodiment are not limited those described in the above embodiment, and modifications, improvements, etc. are possible as appropriate.

For example, although the electronic device 10 according to the embodiment is of the two-axis swivel type, the invention is not limited to such a case and can also be applied to a simple folding type one, a double opening type one which can be opened in the horizontal direction as well as rotated about the two axes, etc., The shapes and structures of the electronic device, first housing, contact member, circuit board, holding ribs, guide rib, pin, shaft portion, groove, head, fitting member, contact portion, nip spring portion, double-sided adhesive tape, etc. are not limited to those described in the embodiment and can be modified as appropriate.

The present application is based on Japanese Patent Application No., 2011-012253 filed on Jan. 24, 2011, the disclosure of which is incorporated herein by reference.

INDUSTRIAL APPLICABILITY

The invention can suitably applied to electronic devices in which the outside surface of a wall of a housing is provided with an external terminal and the external terminal is connected to a circuit board provided inside the housing, as well as to contact members used in such electronic devices.

DESCRIPTION OF REFERENCE NUMERALS AND SIGNS

10: Electronic device
11: First housing (housing)
12: Second housing
13: Hinge
15: Contact member
16: Circuit board
16A: Contact
21: First case
22: First cover
24: Electric components
26: Printed circuit board
28: Inside space
29: Outside
32: Holding rib
33: Guide rib
37: Wall
46: Pin
48: Shaft portion
48A: Base portion of shaft portion
28B: Groove
49: Head
51: Fitting member
52: Contact portion
53: Horizontal rod
54: Contact rod
55: Nip spring portion
56: Vertical rod
57: Spring rod 59: Double-sided adhesive tape
61: Through-hole

The invention claimed is:

1. An electronic device comprising:
   a housing;
   a circuit board contained in the hosing;
   a pin that is inserted, from outside, in a through-hole formed in a wall of the housing, and has a head which is exposed to the outside and a shaft portion which projects into an inside space of the housing, the shaft portion comprising a groove;
   a fitting member that has a L shape and is made of a thin and linear member to be deformed, and is formed with a nip spring portion and a circuit board contact portion, the nip spring portion having a vertical portion and a spring portion which is bent from a top portion of the vertical portion so as to extend approximately parallel with the vertical portion;
   a pair of holding ribs that project from an inside surface of the wall of the housing toward the inside space of the housing in a thickness direction of the housing and hold the fitting member therebetween; and
   a guide rib that is formed on the inside surface of the wall and guides the nip spring portion,
   wherein the nip spring portion nips the groove of the shaft portion elastically in its radial direction in the inside space of the housing to contact with the pin projected as a contact; and
   wherein the circuit board contact portion is in contact with a contact of the circuit board.

2. The electronic device according to claim 1, wherein the circuit board contact portion is formed so as to project from the pair of holding ribs to the circuit board in the thickness direction of the housing to contact with the contact of the circuit board.

3. The electronic device according to claim 1, further comprising:
   a ring-shaped double-sided adhesive tape that is interposed between the head and an outside surface of the wall.

4. The electronic device according to claim 1,
   wherein the spring portion is configured to be a deformed elastically in directions in which the spring portion goes away from and comes closer to the vertical portion, and has a curved portion which is locked in the groove of the shaft portion.

5. The electronic device according to claim 1, wherein the fitting member extends in a projection direction of the pin from the nip spring portion, and has a horizontal portion which connects the circuit board contact portion; and
   wherein the pair of holding ribs nip the horizontal portion and the circuit board contact portion.

* * * * *